United States Patent
Ma et al.

(10) Patent No.: US 7,514,754 B2
(45) Date of Patent: Apr. 7, 2009

(54) COMPLEMENTARY METAL-OXIDE-SEMICONDUCTOR TRANSISTOR FOR AVOIDING A LATCH-UP PROBLEM

(75) Inventors: Shih-Kuei Ma, Hsinchu (TW); Chung-Yeh Lee, Hsinchu (TW); Chun-Ying Yeh, Hsinchu (TW); Ker-Hsiao Huo, Hsinchu (TW)

(73) Assignee: Episil Technologies Inc., Hsinchu (TW)

( * ) Notice: Subject to any disclaimer, the term of this patent is extended or adjusted under 35 U.S.C. 154(b) by 88 days.

(21) Appl. No.: 11/624,698

(22) Filed: Jan. 19, 2007

(65) Prior Publication Data
US 2008/0173951 A1 Jul. 24, 2008

(51) Int. Cl.
*H01L 27/092* (2006.01)
(52) U.S. Cl. ............ 257/370; 257/337; 257/343; 257/372; 257/E27.063; 257/E27.064
(58) Field of Classification Search ............ 257/343, 257/372, 338, 370, E27.063, E27.064
See application file for complete search history.

(56) References Cited

U.S. PATENT DOCUMENTS

| | | | |
|---|---|---|---|
| 3,649,887 A | 3/1972 | Keller et al. | |
| 3,931,634 A | 1/1976 | Knight | |
| 4,027,365 A | 6/1977 | Froeliger | |
| 4,466,011 A | 8/1984 | Van Zanten | |
| 4,879,584 A * | 11/1989 | Takagi et al. | 257/334 |
| 4,890,149 A | 12/1989 | Bertotti et al. | |
| 5,021,860 A | 6/1991 | Bertotti et al. | |
| 5,156,989 A * | 10/1992 | Williams et al. | 438/206 |
| 5,181,095 A * | 1/1993 | Mosher et al. | 257/370 |
| 5,243,214 A | 9/1993 | Sin et al. | |
| 5,495,123 A | 2/1996 | Canclini | |
| 6,365,447 B1 * | 4/2002 | Hebert et al. | 438/203 |

* cited by examiner

*Primary Examiner*—Marcos D Pizarro
*Assistant Examiner*—Tifney L Skyles
(74) *Attorney, Agent, or Firm*—Jianq Chyun IP Office

(57) ABSTRACT

A semiconductor device is provided. The semiconductor device includes a substrate, a first epitaxial layer, a first sinker, a first buried layer, a second epitaxial layer, a second sinker and a second buried layer. The first and second epitaxial layers are disposed sequentially on the substrate. The first sinker and the first buried layer define a first area from the first and the second epitaxial layers. The second sinker and the second buried layer define a second area from the second epitaxial layer in the first area. An active device is disposed in the second area. The first buried layer is disposed between the first area and the substrate, and is connected to the first sinker. The second buried layer is disposed between the second area and the first epitaxial layer, and is connected to the second sinker.

12 Claims, 3 Drawing Sheets

COMPLEMENTARY METAL-OXIDE-SEMICONDUCTOR TRANSISTOR FOR AVOIDING A LATCH-UP PROBLEM

BACKGROUND OF THE INVENTION

1. Field of the Invention

The present invention generally relates to a semiconductor device, and more particularly, to a semiconductor device for avoiding latch-up problem.

2. Description of Related Art

Designation of semiconductor devices is currently driven to advance in accordance with higher degree of integration and more complicated requirements of the semiconductor devices. For example, high-voltage devices must be designed for being operated under a high voltage without interfering with other elements. FIG. 1 is exemplified herebelow to illustrate problems and limitations of a conventional high-voltage device.

FIG. 1 is a cross-sectional view of a conventional high-voltage device, for example, a complementary metal-oxide-semiconductor (CMOS) transistor composed of two lateral double-diffused metal-oxide-semiconductor (LDMOS) transistors.

Referring to FIG. 1, the high-voltage device includes P-type substrate 100, gates 102, 104, gate dielectric layers 106, 108, P-well 112$p$, a P-tub 114P, doped regions 116$p$, 118$p$, 120$p$, N-tubs 122$n$, 124$n$, doped regions 126$n$, 128$n$, 130$n$, isolation structure 134, dielectric layer 136, interconnect 138 and dielectric layer 140. The P-type substrate 100 includes a high-voltage N-type metal-oxide-semiconductor (HVNMOS) transistor in an area marked as HVNMOS, and a high-voltage P-type metal-oxide-semiconductor (HVPMOS) transistor in an area marked as HVPMOS. The doped regions 126$n$, 128$n$ and the gate 102 serve as source, drain and gate of the HVNMOS transistor respectively, and the doped regions 120$p$, 118$p$ and gate 104 serve as source, drain, and gate of the HVPMOS transistor respectively. The doped regions 116$p$, 118$p$ and 120$p$ are of p+ conductive type, and the doped regions 126$n$, 128$n$ and 130$n$ are of n+ conductive type.

The conventional high-voltage device shown in FIG. 1 has following disadvantages:

1. Such a high-voltage device is likely have a latch-up problem. The doped region 120$p$, the N-tub 124$n$ and the P-type substrate 100 serve respectively as an emitter, a base and a collector that constitute a parasitic bipolar transistor, and doped regions 126$n$, P-type substrate 100 and N-tub 124$n$ serve respectively as an emitter, a base and a collector that constitute another parasitic bipolar transistor. As such, when a product of current gains of these two double carrier transistors is greater than 1, the high-voltage device is incapable of operating normally.

2. The aforementioned HVPMOS transistor and HVNMOS transistor are disposed on a P-type substrate 100. Therefore, input voltage applied on the doped region 120$p$ is directly applied on the P-type substrate 100. Accordingly, input voltage of the device is very much restricted, thus limiting operation range of such high-voltage devices.

3. Generally, there are often some other semiconductor elements disposed on the P-type substrate 100. However, the conventional high-voltage device provides no isolation structure for isolating those other elements from the high-voltage device in order to avoid interference therebetween.

Accordingly, operation of one semiconductor element affects the others on the substrate, and therefore must be improved.

SUMMARY OF THE INVENTION

Accordingly, the present invention is directed to a semiconductor device for improving the restricted input voltage range and capable of reducing the possibility of interfering with other semiconductor elements.

The present invention is also directed to a CMOS transistor for eliminating a latch-up problem.

The present invention provides a semiconductor device, which includes a substrate, a first epitaxial layer, a first sinker and a first buried layer, of a first conductive type, and a second epitaxial layer, a second sinker and a second buried layer, of a second conductive type. The first epitaxial layer is configured on the substrate, and the second epitaxial layer is configured on the first epitaxial layer. The first sinker disposed in the first epitaxial layer and the second epitaxial layer extends from the substrate to an upper surface of the second epitaxial layer and defines a first area from the first epitaxial layer and the second epitaxial layer. The second sinker disposed in the second epitaxial layer extends from the first epitaxial layer to the upper surface of the second epitaxial layer and defines a second area from the first area of the second epitaxial layer. Active devices are disposed in the second area. The first buried layer is disposed between the first area and the substrate, and is connected with the first sinker. The second buried layer is disposed between the second area and the first epitaxial layer, and is connected with the second sinker.

According to an aspect of the present invention, a dopant density of the foregoing first buried layer is greater than a dopant density of the substrate.

According to an aspect of the present invention, a dopant density of the foregoing second buried layer is greater than a dopant density of the second epitaxial layer.

According to an embodiment of the present invention, the active device, for example, includes a high-voltage metal-oxide-semiconductor (HVMOS) transistor.

According to an embodiment of the present invention, the first conductive type is P-type, and the second conductive type is N-type. According to another embodiment of the present invention, the first conductive type is N-type, and the second conductive type is P-type.

The present invention also provides a CMOS transistor, which includes a substrate, a first epitaxial layer, a second epitaxial layer, a first sinker, a second sinker, a third sinker, a fourth sinker, a well region, a first transistor, a second transistor, a first buried layer, a second buried layer, a third buried layer and a fourth buried layer. The substrate is of a first conductive type. The first epitaxial layer is of the first conductive type and is disposed on the substrate. The second epitaxial layer is of a second conductive type and is disposed on the first epitaxial layer. The first sinker is of the first conductive type, and is disposed in the first epitaxial layer and the second epitaxial layer. The first sinker extends from the substrate to an upper surface of the second epitaxial layer, and defines a first area from the first epitaxial layer and the second epitaxial layer. The second sinker is of the second conductive type, and is disposed in the second epitaxial layer. The second sinker extends from the first epitaxial layer to the upper surface of the second epitaxial layer, and defines a second area from the second epitaxial of the first area. The third sinker is of the first conductive type, and is disposed in the first and second epitaxial layers other than the first area. The third sinker extends from the substrate to the upper surface of the second epitaxial layer and defines a third area from the first epitaxial layer and the second epitaxial layer. The fourth sinker is of the second conductive type, and is disposed in the second epitaxial layer. The fourth sinker extends from the first epitaxial layer to the upper surface of the second epitaxial layer, and defines a fourth area from the second epitaxial layer of the third area. The well region is of the first conductive type, and is disposed in the second area. The first transistor is disposed in the well region, and the second transistor is disposed in the fourth area. The first buried layer is of the first conductive type, and is disposed between the first area and the substrate. The first buried layer is connected with the first sinker. The second buried layer is of the second conductive type, and is disposed between the second area and the first epitaxial layer. The second buried layer is connected with the second sinker. The third buried layer is of the first conductive type, and is disposed between the third area and the substrate. The third buried layer is connected with the third sinker. The fourth buried layer is of the second conductive type, and is disposed between the fourth area and the first epitaxial layer. The fourth buried layer is connected with the fourth sinker.

According to an aspect of the present invention, dopant densities of the respective foregoing first buried layer and third buried layer are greater than a dopant density of the substrate.

According to an aspect of the present invention, dopant densities of the respective foregoing second buried layer and fourth buried layer are greater than a dopant density of the second epitaxial layer.

According to an embodiment of the present invention, the first transistor and the second transistor include, for example, HVMOS transistors.

According to an embodiment of the present invention, the first conductive type is P-type, and the second conductive type is N-type. According to another embodiment of the present invention, the first conductive type is N-type, and the second conductive type is P-type.

In brief, the present invention can prevent latch-up of the CMOS transistor, broaden the range of the input voltage, and provide isolation from other semiconductor devices on the substrate.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
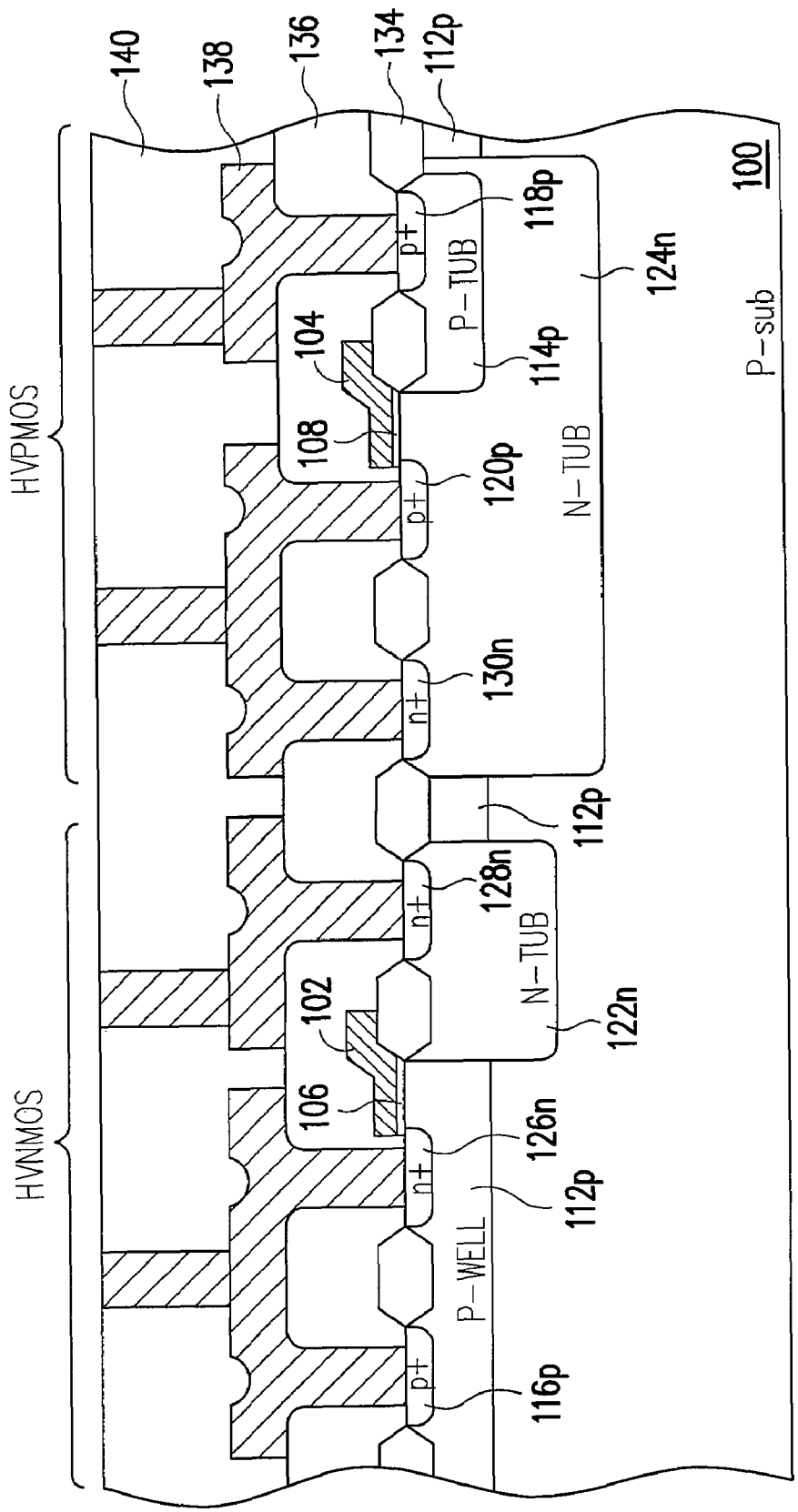
FIG. 1 is a schematic cross-sectional view of a conventional high-voltage semiconductor device.

Reference will now be made in detail to the present preferred embodiments of the invention, examples of which are illustrated in the accompanying drawings. Wherever possible, the same reference numbers are used in the drawings and the description to refer to the same or like parts.

In order to resolve the problems of the conventional semiconductor devices described above, the present invention integrates the semiconductor devices in an epitaxial layer on the substrate. The epitaxial layer includes a first epitaxial layer and a second epitaxial layer sequentially disposed on the substrate. The first epitaxial layer is of a conductive type same as that of the substrate, and the second epitaxial layer is of another conductive type contrary to that of the substrate. The first epitaxial layer and the second epitaxial layer provide a functionality of diode in current rectification, preventing carriers from drifting into the substrate. The dopant density of the substrate is greater than that of the first epitaxial layer. The substrate, for example, is grounded, and provides a low impedance path for conducting excessive carriers out. In such a way, the excessive carrier will not adversely influence the other semiconductor devices disposed on the substrate.

Furthermore, buried layers can be configured between the second epitaxial layer and the first epitaxial layer, and between the first epitaxial layer and the substrate, respectively, and the buried layers can be electrically connected to external via respective sinker. Electric potentials of the buried layers are adjusted to avoid applying the whole input voltage upon the substrate. Thus, the operation range of the semiconductor devices is enlarged. Moreover, by configuring the buried layers, the structures of the parasitic diode or the parasitic transistor are altered. Therefore, the possibility of latch-up of the semiconductor device may be effectively eliminated.

First Embodiment

Figure 2:
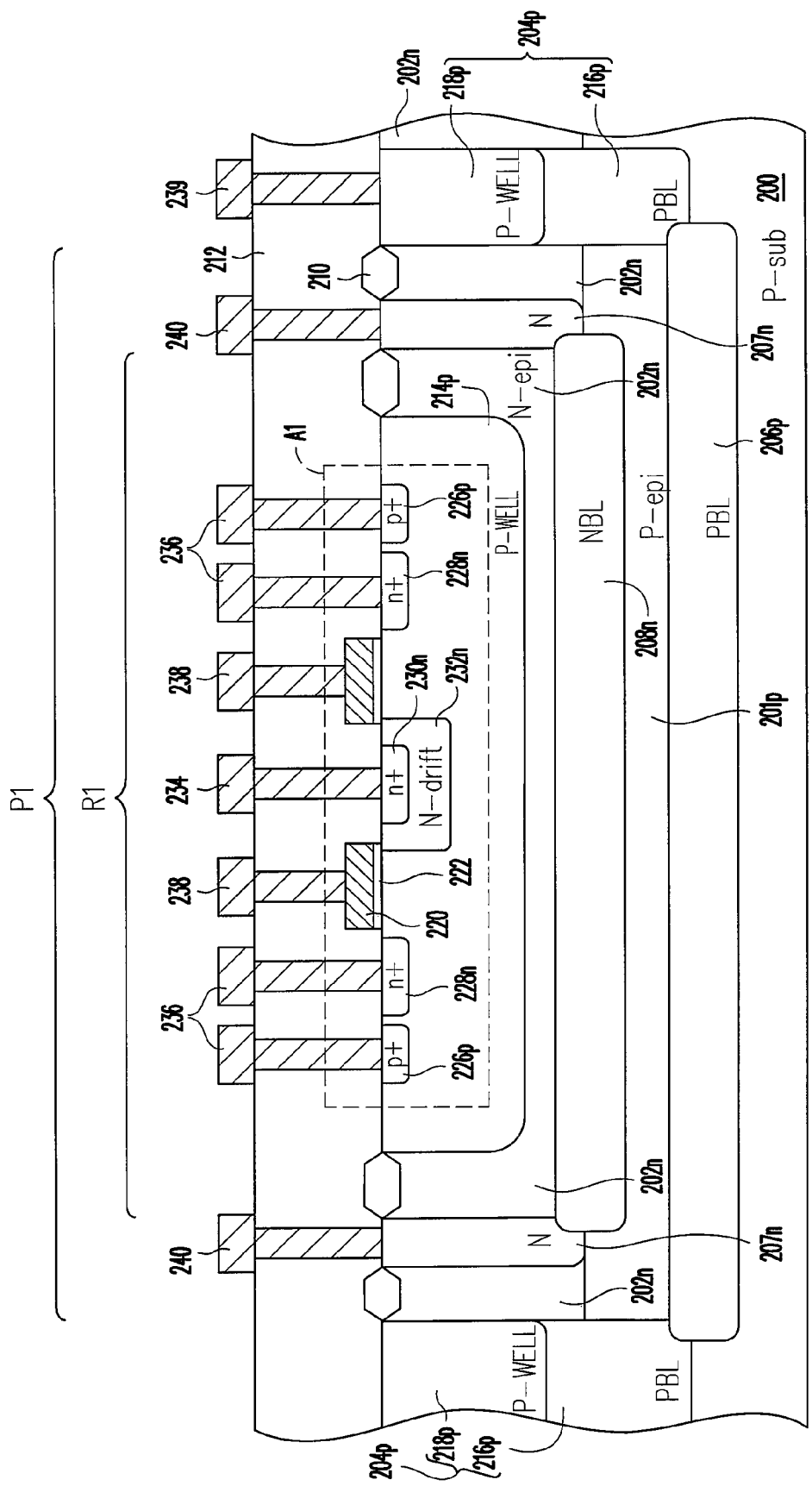
FIG. 2 is a schematic cross-sectional view of a semiconductor device according to a first embodiment of the present invention.

FIG. 2 is a schematic cross-sectional view of a semiconductor device according to a first embodiment of the present invention.

Referring to FIG. 2, the semiconductor device of the present invention includes a substrate 200, a first epitaxial layer 201*p*, a second epitaxial layer 202, a first sinker 204*p*, a first buried layer 206*p*, a second sinker 207*n*, a second buried layer 208*n* and an active device A1. According to an aspect of the embodiment, the semiconductor device further includes but not limited to an isolation structure 210, a dielectric layer 212, a well region 214*p*, and interconnects 234, 236, 238, 239 and 240. The active device A1, for example, is comprised of an HVMOS transistor including LDMOS transistors. The active device A1 includes a gate 220, a gate dielectric layer 222, doped regions 226*p*, 228*n*, 230*n* and 232*n*. Further, as shown in FIG. 2, the conductive types of the foregoing elements are labeled in FIG. 2 as P-sub, P-epi, N-epi, N, PBL, NBL, P-WELL, n+, p+, N-drift, respectively, however this is not intended for limiting the scope of the present invention as such. Furthermore, in the present embodiment, the first conductive type is P-type, and the second conductive type is N-type. In another embodiment of the present invention, the first conductive type is N-type, and the second conductive type is P-type.

In an embodiment of the present invention, as shown in FIG. 2, the substrate 200 is of the first conductive type. The first epitaxial layer 201*p* is of the first conductive type, and is disposed on the substrate 200. A dopant density of the substrate 200 is for example greater than that of the first epitaxial layer 201*p*. When the substrate 200 is grounded, the substrate 200 provides a low impedance path for conducting excessive carriers generated from operation of the active device A1. In this way, the excessive carriers may be not adversely affect other semiconductor elements on the substrate 200.

The second epitaxial layer 202*n* is of the second conductive type, and is disposed on the first epitaxial layer 201*p*. The second epitaxial layer 202*n* and the first epitaxial layer 201*p* constitute a diode. In operating the active device A1, a rectification function of the diode prevents the carriers from flowing into the first epitaxial layer 201*p* and the substrate 200.

The first sinker 204*p* is of the first conductive type, and is disposed in the first epitaxial layer 201*p* and the second epitaxial layer 202*n*. The first sinker 204*p* extends from the substrate 200 to an upper surface of the second epitaxial layer 202n, and defines a first area P1 from the first epitaxial layer 201p and the second epitaxial layer 202n. The interconnect 239 is disposed in the dielectric layer 212 and electrically connected to the first sinker 204p. According to the embodiment, the first sinker 204p for example is composed of a buried layer 216p and a well region 218p. The buried layer 216p extends form the substrate 200 to the second epitaxial layer 202n, and the well 218p extends from the buried layer 216p to the upper surface of the second epitaxial layer 202n.

The second sinker 207n is of the second conductive type, and is disposed in the second epitaxial layer 202n. The second sinker 207n extends from the first epitaxial layer 201p to the upper surface of the second epitaxial layer 202n, and defines a second area R1 from the second epitaxial layer 202n of the first area P1. Furthermore, the interconnect 240 is disposed in the dielectric layer 212, and is electrically connected to the second sinker 207n. The well region 214p is of first conductive type, and is disposed in the second area R1. The active device A1, for example, is disposed in the well region 214p. In fabricating the semiconductor device, the well region 214p, for example, is configured together with the well region 218p. The doped region 226p of the active device A1 is of the first conductive type, and doped regions 228n, 230n, and 232n are of the second conductive type. Doped regions 228n, 230n and 232n respectively serve as source, drain and drift region of the active device A1. The doped regions 228n and 230n are disposed in the well region 214p distributed at both sides of the gate 220. The doped region 230n is configured in the doped region 232n. The interconnects 234, 238 and 236 are disposed in the dielectric layer 212, and are electrically connected to the doped region 230n, the gate 220, the doped regions 228n and 226p, respectively.

The first buried layer 206p is of the first conductive type, and is disposed between the first area P1 and the substrate 200. The first buried layer 206p is connected to the first sinker 204p. The second buried layer 208n is of the second conductive type, and is disposed between the second area R1 and the first epitaxial layer 201p. The second buried layer 208n is connected to the second sinker 207n. The first buried layer 206p and the second buried layer 208n, for example, are heavily doped doped regions. The first buried layer 206p, for example, has a dopant density greater than that of the substrate 200, and the second buried layer 208n for example has a dopant density greater than that of the second epitaxial layer 202n. Because of arrangement of the first buried layer 206p and the second buried layer 208n, the input voltage of the active device A1 may not be completely applied on the substrate 200. Therefore, operation range of the input voltage can be increased. For example, when a high voltage is applied on the interconnect 234, the second buried layer 208n can prevent a breakdown at an interface between the second epitaxial layer 202n and the first epitaxial layer 201p. Furthermore, when a high voltage is applied on the interconnect 234, the electric potential of the interconnect 240, for example, is lower than that of the interconnect 234 and higher than that of the interconnect 236. Thus, the high voltage is directly applied to the interconnect 240, and therefore breaking down at the interface between the second epitaxial layer 202n and the first epitaxial layer 201p may be effectively avoided. On another hand, electric potential of the interconnect 239 can be adjusted to avoid the high voltage to be applied to the substrate 200. Therefore, the range of voltage applied to the interconnect 234 can be increased. Obviously, the range of voltage applied to the interconnect 236 can be increased accordingly. Therefore, the first sinker 204p, the second sinker 207n, the first buried layer 206p, and the second buried layer 208n are adapted for absorbing excessive carriers, so as to prevent voltages applied to the active device A1 from interfering other semiconductor elements disposed on the substrate 200. Accordingly, operation of the active device A1 may not cause latch-up of other semiconductor device. According to another aspect of the embodiment, input voltages of the other semiconductor elements can also be prevented from interfering the operation of the active device A1 by adjusting electric potentials of the interconnects 239 and 240.

The foregoing semiconductor device is adapted for avoiding latch-up, that is to be illustrated in details taking a CMOS transistor as an example.

Second Embodiment

Figure 3:
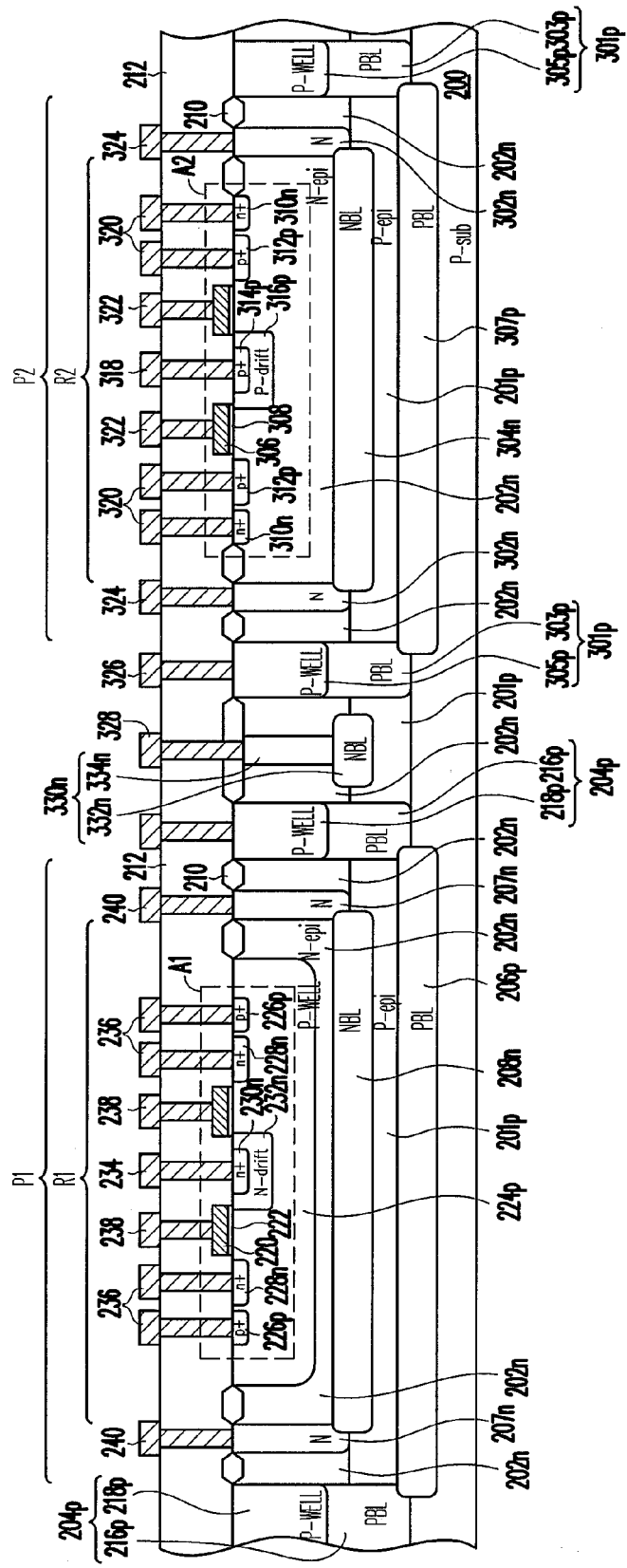
FIG. 3 is a schematic cross-sectional view of a CMOS transistor according to a second embodiment of the present invention.

FIG. 3 is a schematic cross-sectional view of a CMOS transistor according to a second embodiment of the present invention. For simplification, only those different from the first embodiment are to be illustrated below.

Referring to FIG. 3, the CMOS transistor includes a first transistor and a second transistor A2. According to the present embodiment, the first transistor may be, for example but is not limited to, equivalent to the foregoing active device A1, e.g., a HVMOS transistor, and the second transistor may be, for example but is not limited to, a HVMOS transistor. In other words, the first transistor and the second transistor A2 can be any metal-oxide-semiconductor transistors. Furthermore, the CMOS transistor, for example, includes interconnects 318, 320, 322, 324, 326, and 328 disposed in the dielectric layer 212. However, it is to be noted that the foregoing is for the purpose of illustration only, and it is not intended to limit the scope of the present invention.

The CMOS transistor further includes a third sinker 301p, a third buried layer 307p, a fourth sinker 302n and a fourth buried layer 304n. The third sinker 301p is of the first conductive type, and is disposed in the first epitaxial layer 201p and the second epitaxial layer 202n besides the first area P1. The third sinker 301p extends from the substrate 200 to an upper surface of the second epitaxial layer 202n, and defines a third area P2 from the first epitaxial layer 201p and the second epitaxial layer 202n. The interconnect 326 is electrically connected to the third sinker 301p. In the embodiment, the third sinker 301p, for example, is composed of a buried layer 303p and a well region 305p. The buried layer 303p extends from the substrate 200 to the second epitaxial layer 202n, and the well region 305p extends from the buried layer 303p to the upper surface of the second epitaxial layer 202n.

The fourth sinker 302n is of the second conductive type, and is disposed in the second epitaxial layer 202n. The fourth sinker 302n extends from the first epitaxial layer 201p to the upper surface of the second epitaxial layer 202n, and defines a fourth area R2 from the second epitaxial layer 202n of the third area P2. Furthermore, the interconnect 324 is electrically connected to the fourth sinker 302n. The second transistor A2 is disposed in the fourth area R2. The second transistor A2 includes a gate 306, a gate dielectric layer 308, and doped regions 310n, 312p, 314p, and 316p. The doped regions 312p, 314p, and 316p respectively serve as source, drain, and drift region of the second transistor A2. The doped region 310n is of the second conductive type, while the doped regions 312p, 314p, and 316p are of the first conductive type. The doped regions 312p and 314p are distributed in the second epitaxial layer 202n and at both sides of the gate 306. The doped region 314p is disposed in the doped region 316p. According to the embodiment, the doped region 316p is labeled as P-drift. The interconnects 318, 322, and 320 are electrically connected to doped region 314p, the gate 306, doped regions 310n and 312p, respectively.

The third buried layer 307p is of the first conductive type, and is disposed between the third area P2 and the substrate 200. The third buried layer 307p is connected to the third sinker 301p. The fourth buried layer 304n is of the second conductive type, and is disposed between the fourth area R2 and the first epitaxial layer 201p. The fourth buried layer 304n is connected to the fourth sinker 302n. Parasitic diode structures constituted by the doped region 312p, the second epitaxial layer 202n, the first epitaxial layer 201p, the substrate 200 and the doped region 228n are changed by employing the first buried layer 206p, the first sinker 204p, the second buried layer 208n, the second sinker 207n, the third buried layer 307p, the third sinker 301p, the fourth buried layer 304n and the fourth sinker 302n. Thus, latch-up can be avoided thereby.

During the fabrication of the CMOS transistor, the third buried layer 307p, for example, is configured together with the first buried layer 206p, and the fourth buried layer 304n is configured together with the second buried layer 207n. The first buried layer 206p, for example, is a heavily doped doped region, and the dopant density thereof is greater than that of the substrate 200. In this embodiment, the dopant density of the third buried layer 307p is greater than that of the substrate 200. Likewise, because the dopant density of the second buried layer 207n is preferably greater than that of the second epitaxial layer 202n, the dopant density of the fourth buried layer 304n is greater than that of the second epitaxial layer 202n. Furthermore, the doped region 312p, the second epitaxial layer 202n that correspond to the third area P2, and the substrate 200, constitute an emitter, a base and a collector of a parasitic bipolar transistor, and the doped region 228n, the substrate 200, and the second epitaxial layer 202n that corresponds to the third area P2, constitute an emitter, a base, and a collector of another parasitic bipolar transistor. The third buried layer 307p and the fourth buried layer 304n can be heavily doped doped regions, and the above bases can have relatively high dopant densities. As such, the foregoing bipolar transistors have relatively low current gains. Moreover, the current gains can be modified by adjusting electric potentials of the interconnects 239, 324, and 326, to further prevent latch-up problem.

Accordingly, the range of voltages applied on the second transistor A2 can be increased. For example, when a high voltage is applied to the interconnect 320, by adjusting electric potentials of the interconnects 324 and 326, the foregoing input voltage can be applied directly on the interconnects 324 and 326, and are prevented from applying directly on the substrate 200, and therefore the possibility of breakdown at the interface between the second epitaxial layer 202n and the first epitaxial layer 201p may be effectively reduced. The range of voltage applied on the interconnect 320 can be increased. Therefore, the range of voltage applied on the interconnect 318 may be effectively increased accordingly. Furthermore, by employing the third buried layer 307p, the third sinker 301p, the fourth buried layer 304n and the fourth sinker 302n, the second transistor A2 and other semiconductor elements on the substrate 200 can be effectively isolated from each other.

According to an embodiment of the present invention, the CMOS transistor further includes a carrier collecting region 330n of second conductive type. The carrier collecting region 330n, for example, is composed of the buried layer 332n and the isolation region 334n. The buried layer 332n for example is disposed between the first epitaxial layer 201p and the second epitaxial layer 202n. The isolation region 334n, for example, extends from the buried layer 332n to the upper surface of the second epitaxial layer 202n. Furthermore, in fabricating the CMOS transistor, the buried layer 332n is for example configured together with the fourth buried layer 304n, and the isolation region 334n is, for example, configured together with the fourth sinker 302n. The interconnect 328 is electrically connected to the isolation region 334n. Excessive carriers between the first transistor and the second transistor A2 can be absorbed by the carrier collecting region 330n, that allow the CMOS transistor to work normally.

In summary, the present invention is adapted for preventing latch-up of a CMOS transistor, and increasing operation range of input voltage of the semiconductor device thereof. Furthermore, the CMOS device can be effectively isolated from other semiconductor elements on the substrate. The sinker usually occupies a smaller space of the applicable area of the substrate, and the buried layer is disposed beneath the active device, and therefore the integration of the device may be effectively promoted.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device, comprising:
   a substrate of a first conductive type;
   a first epitaxial layer of the first conductive type, disposed on the substrate;
   a second epitaxial layer of a second conductive type, disposed on the first epitaxial layer;
   a first sinker of the first conductive type, disposed in the first epitaxial layer and the second epitaxial layer, and extending from the substrate to an upper surface of the second epitaxial layer and defining a first area from the first epitaxial layer and the second epitaxial layer;
   a second sinker of the second conductive type, disposed in the second epitaxial layer extending from the first epitaxial layer to the upper surface of the second epitaxial layer and defining a second area from the second epitaxial layer of the first area;
   an active device, disposed in the second area;
   a first buried layer of the first conductive type, disposed between the first epitaxial layer and the substrate in the first area, and connected to the first sinker; and
   a second buried layer of the second conductive type, disposed between the second epitaxial layer and the first epitaxial layer in the second area, and connected to the second sinker.

2. The semiconductor device according to claim 1, wherein the first buried layer comprises a dopant density greater than a dopant density of the substrate.

3. The semiconductor device according to claim 1, wherein the second buried layer comprises a dopant density greater than a dopant density of the second epitaxial layer.

4. The semiconductor device according to claim 1, wherein the active device comprises a high-voltage metal-oxide-semiconductor (HVMOS) transistor.

5. The semiconductor device according to claim 1, wherein the first conductive type comprises a P-type, and the second conductive type comprises a N-type.

6. The semiconductor device according to claim 1, wherein the first conductive type comprises a N-type, and the second conductive type comprises a P-type.

7. A complementary metal-oxide-semiconductor (CMOS) transistor, comprising:

a substrate of a first conductive type;

a first epitaxial layer of the fist conductive type, disposed on the substrate;

a second epitaxial layer of a second conductive type, disposed on the first epitaxial layer;

a first sinker of the first conductive type, disposed in the first epitaxial layer and the second epitaxial layer, wherein the first sinker extends from the substrate to an upper surface of the second epitaxial layer and defines a first area from the first epitaxial layer and the second epitaxial layer;

a second sinker of the second conductive type, disposed in the second epitaxial layer, wherein the second sinker extends from the first epitaxial layer to the upper surface of the second epitaxial layer and defines a second area from the second epitaxial of the first area;

a third sinker of the first conductive type, disposed in the first and second epitaxial layers, wherein the third sinker extends from the substrate to the upper surface of the second epitaxial layer and defines a third area from the first epitaxial layer and the second epitaxial layer;

a fourth sinker of the second conductive type, disposed in the second epitaxial layer, wherein the fourth sinker extends from the first epitaxial layer to the upper surface of the second epitaxial layer and defines a fourth area from the second epitaxial layer of the third area;

a well region of the first conductive type, disposed in the second area;

a first transistor, disposed in the well region;

a second transistor, disposed in the fourth area;

a first buried layer of the first conductive type, disposed between the first epitaxial layer and the substrate in the first area, and connected to the first sinker;

a second buried layer of the second conductive type, disposed between the second epitaxial layer and the first epitaxial layer in the second area, and connected to the second sinker;

a third buried layer of the first conductive type, disposed between the first epitaxial layer and the substrate in the third area, and connected to the third sinker; and a fourth buried layer of the second conductive type, disposed between the second epitaxial layer and the first epitaxial layer in the fourth area, and connected to the fourth sinker.

8. The CMOS transistor according to claim 7, wherein the first buried layer and third buried layer comprise a dopant density greater than a dopant density of the substrate.

9. The CMOS transistor according to claim 7, wherein the second buried layer and fourth buried layer comprise a dopant density greater than a dopant density of the second epitaxial layer.

10. The CMOS transistor according to claim 7, wherein the first transistor and the second transistor comprise HVMOS transistors.

11. The CMOS transistor according to claim 7, wherein the first conductive type comprises a P-type, and the second conductive type comprises a N-type.

12. The CMOS transistor according to claim 7, wherein the first conductive type comprises a N-type, and the second conductive type comprises a P-type.

* * * * *